(12) United States Patent
Joos et al.

(10) Patent No.: US 7,924,021 B2
(45) Date of Patent: Apr. 12, 2011

(54) PROCEDURE FOR TESTING THE FUNCTION OF A LAMP CIRCUIT

(75) Inventors: Uli Joos, Nonnenhorn (DE); Jochen Zwick, Markdorf (DE); Nicolai Jeutner, Fürth (DE)

(73) Assignee: Conti Temic Microelectronic, GmbH, Nuremberg (DE)

( * ) Notice: Subject to any disclaimer, the term of this patent is extended or adjusted under 35 U.S.C. 154(b) by 351 days.

(21) Appl. No.: 10/582,455

(22) PCT Filed: Nov. 19, 2004

(86) PCT No.: PCT/DE2004/002549
§ 371 (c)(1),
(2), (4) Date: May 14, 2007

(87) PCT Pub. No.: WO2005/057231
PCT Pub. Date: Jun. 23, 2005

(65) Prior Publication Data
US 2008/0061791 A1    Mar. 13, 2008

(30) Foreign Application Priority Data

Dec. 11, 2003 (DE) .................................. 103 58 383
Feb. 25, 2004 (DE) ......................... 10 2004 009 006

(51) Int. Cl.
G01R 31/08    (2006.01)

(52) U.S. Cl. ........................................ 324/525; 324/522

(58) Field of Classification Search .................. 324/525, 324/522
See application file for complete search history.

(56) References Cited

U.S. PATENT DOCUMENTS

| | | | |
|---|---|---|---|
| 5,057,814 A * | 10/1991 | Onan et al. ..................... | 340/458 |
| 5,578,998 A | 11/1996 | Kasprowicz | |
| 5,592,051 A | 1/1997 | Korkala | |
| 5,952,832 A * | 9/1999 | Stevanovic et al. ........... | 324/414 |
| 5,986,462 A | 11/1999 | Thomas et al. | |
| 6,008,593 A | 12/1999 | Ribarich | |
| 6,172,966 B1 | 1/2001 | Taillibert et al. | |
| 6,556,017 B1 * | 4/2003 | Pettersson ..................... | 324/414 |
| 2001/0045833 A1 | 11/2001 | Tury et al. | |

FOREIGN PATENT DOCUMENTS

| | | |
|---|---|---|
| DE | 41 07 415 C2 | 10/1995 |
| DE | 101 61 760 A1 | 7/2003 |
| EP | 05 07 186 A | 10/1992 |
| EP | 11 74 720 A2 | 1/2002 |
| GB | 11 25 089 | 8/1968 |
| GB | 2034948 A | 6/1980 |
| GB | 22 52 685 | 8/1992 |
| GB | 23 41 017 | 3/2000 |

* cited by examiner

*Primary Examiner* — Amy He

(57) ABSTRACT

The function of a lamp circuit is tested by measuring the current and voltage. A resistance value is taken into account which is specified as a polynomial of at least the 1st order depending on the effective measured voltage on the lamp circuit. The parameters of the polynomial are determined by a quantity of measurements which correspond to the order of the polynomial, under operating conditions which are known to differ, and the specific resistance value or a value derived from it are compared with a specified value.

9 Claims, 4 Drawing Sheets

PROCEDURE FOR TESTING THE FUNCTION OF A LAMP CIRCUIT

BACKGROUND OF THE INVENTION

The invention relates to a procedure for testing the function of a lamp circuit, consisting of at least one lamp, by measuring the current and voltage.

The nominal power of a lamp is the electrical power input of the lamp when defined standard conditions are present, in particular the application of a nominal voltage; it is given by lamp manufacturers as a lamp parameter alongside the nominal voltage, and is required by manufacturers of lighting systems as a standard value to be maintained. However, some lamps deviate significantly from the given standard values, which may lead to faults or defects in the lighting control or the lamps.

Lighting systems are also used in safety-related applications, in particular in motor vehicles. With safety-critical applications of this type, it is necessary to check during operation for defects, or for non standard-compliant lamps which may have been installed.

For example, when filament lamps are triggered in the motor vehicle, the switch output can already be diagnosed by the electronic system, for example, and information can be provided regarding the state of the load. By recognising the operating states and/or the measurement of the determining electrical values, the failure of the lamp can be detected, and a message can be sent to the driver or to a diagnosis system.

The precision of the diagnosis procedure is restricted by different parameters, such as the precision of the measurements, for example, and above all by the electrical model of the lamps used.

The simplest procedure for determining the lamp state is a digital determination of the output voltage when in a switched-off state. When the lamp is defective, the circuit is interrupted, which can be detected on the voltage level.

Improved procedures use a current measurement when the lamp is in a switched-on state, with a measuring resistor or current mirror switches or integrated solutions such as the so-called "SenseFETs" with a control input and a current signal output, as illustrated in FIG. 1.

However, the voltage on the lamp circuit cannot be adopted accordingly as a constant value of the nominal voltage in a wide range of applications, in particular in motor vehicles. However, if the voltage deviates from the nominal voltage, the current power input produced from the voltage and current does not correspond to the nominal power.

In addition, the current lamp resistance may fluctuate due to:
the use of different lamp types
the different nominal voltage of the different lamp types
deviations from different manufacturers
scattering within a lamp type
lamp ageing.

Particularly problematic is the diagnosis with two or more lamps which are switched in parallel, which can only be detected, if at all, when the electronic system is calibrated.

In addition, the use of intact lamps which deviate from the specification, however, or a fault in individual lamps, can lead to faults on the control unit or other lamps which are switched in parallel with the lamp.

A procedure for testing the function of a lamp circuit consisting of at least one lamp is known from U.S. Pat. No. 5,578,998. The function test is conducted by measuring the current and the voltage on a resistance.

A further procedure for testing the function of a lamp is known from EP-A-0 507. In order to test the function, the current and the voltage are measured on a resistance.

SUMMARY OF THE INVENTION

The object of the invention is to provide a procedure for testing the function of a lamp circuit which also enables a function test with a high level of precision even when the operating voltage deviates from the nominal voltage. This object is attained by a method for testing the function of a lamp circuit having at least one lamp. The method comprising includes measuring a current and voltage of the lamp circuit and specifying a resistance value as a polynomial having an order, depending on the measured voltage of the lamp circuit, wherein parameters of the polynomial are determined by a number of measurements which at least correspond to the order of the polynomial when operating conditions are known to differ, and the resistance value or a value derived from the resistance value are compared with a specified value.

The lamp circuit consists of at least one lamp, i.e. the procedure is also suitable in particular for a lamp circuit with several lamps switched in parallel. By measuring the current and voltage, the effective operating state is recorded. Each function test is based on a comparison of measured values with set values.

Here, a polynomial of at least the $1^{st}$ order, according to $R=c*U+d$, is taken into account for the resistance value, depending on the voltage effectively measured on the lamp circuit. Finally, it is not of decisive importance here whether the polynomial is taken into account in relation to the set values, or when the measured values are converted into derived values, i.e. whether the measured values are standardised according to constant set values or the set values are adapted to the operating conditions.

The resistance value of the lamp can be determined as a polynomial of at least the $1^{st}$ order, or can be derived from a further value, as will be explained in detail below.

The parameters of the polynomial are determined by a quantity of measurements which at least correspond to the order of the polynomial when operating conditions are known to be different.

The higher the order of the polynomial, the more precisely the set values can be predicted, or the measured values can be approximated to a fixed set value.

Preferably, the resistance value is related to the nominal power, in which the parameters of the polynomial of the resistance value are in each case multiplied with the nominal power when operating conditions are known. In this way, when different lamps are used, a lower degree of fluctuation and improved value specification can be achieved.

If the lamps show nominal voltages which deviate from each other under the nominal power, the parameters of the polynomial are standardised to a shared nominal voltage, in which, when measurements are taken when the operating conditions are known, the parameters of the polynomial of the resistance value are in each case multiplied by the ratio from the shared nominal voltage to the determined voltage of the lamps under nominal voltage. In this way, when different lamps are used, an even lower degree of fluctuation and a better value specification can be achieved.

Preferably, the nominal power of the lamp circuit can be determined as the value to be compared with a specified value which is determined from the current and voltage, and the parameters of the polynomial of the resistance value which are determined from the reference measurements in order to determine the calculable nominal power for the lamp currently installed, and which are compared with the set value.

Alternatively, the set current through the lamp circuit under the effective voltage can be determined as a specified value, i.e. from the voltage, the parameters are first used to calculate the resistance value for the effective voltage, which is then used to determine the anticipated set current, and compared with the actual current.

Here, each of the standardisations for nominal power and nominal voltage are naturally taken into account in each case.

As a result, a lighting system consisting of at least one lamp and one control unit is possible, which records the current and voltage, and calculates the resistance of the lamp or a value which is derived from it, compares it with the specified values and detects any deviation which may occur from the specified values which indicates that the lamp is defective or does not comply with the specification.

Thanks to the improved approximation, two or more lamps which are switched in parallel can be monitored together, and it can be detected whether one of the lamps is defective or does not comply with the specification. Preferably, with lamps of a different nominal power or resistance, a conclusion is reached from the scale of the deviation from the specified values as to which of the lamps which are switched in parallel is defective.

BRIEF DESCRIPTION OF THE DRAWINGS

The invention shall now be explained below in greater detail by way of exemplary embodiments which are explained with reference to the drawings, in which.

DETAILED DESCRIPTION OF THE DRAWINGS

The present invention therefore describes a procedure for testing the function of a lamp circuit, in particular for the precise determination of the nominal lamp power from the measured lamp current under operating voltage, using an empirically determined lamp model.

Here, measurements are first taken in measuring rows with operating conditions of the working current of the lamp which are known to differ from each other, depending on the operating voltage and for one lamp type in each case, and these measurements are then used to calculate the parameters for the polynomial of the resistor.

The quantity of measurements already corresponds at least to the order of the polynomial in order to ensure the unambiguousness of the calculation of the parameters, although in practise, it is significantly larger in order to offset the measurement fluctuations. The parameters are then accordingly well approximated, but can be adopted as a constant, however, for the subsequent measurements when the operating voltage deviates from the nominal voltage.

In this way, with a current measured voltage which is derived from these constant parameters, the resistance can be determined far more precisely, and therefore a more exact value can be given for the nominal power.

Figure 1:
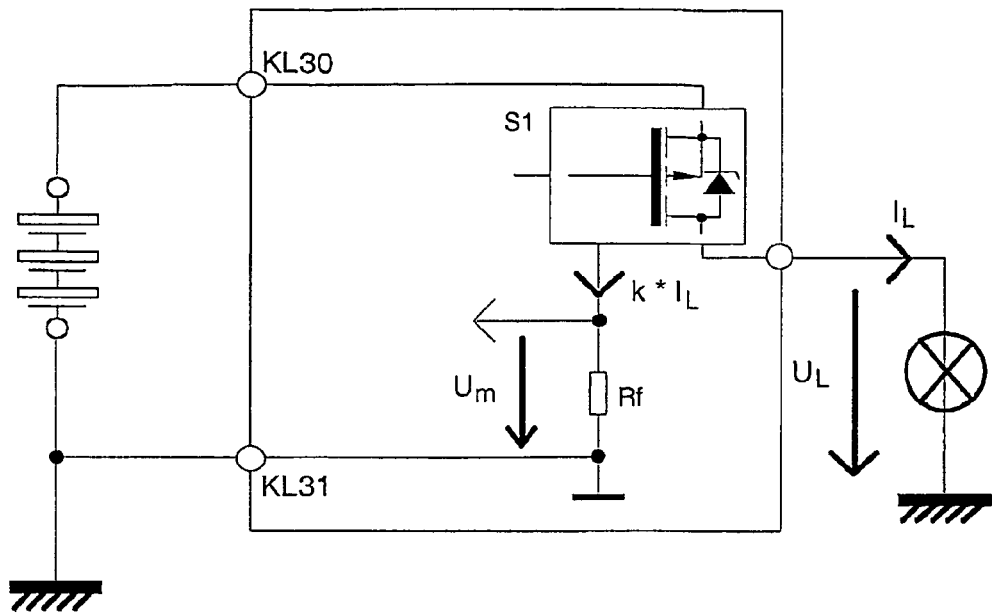
FIG. 1 shows a preferred switch arrangement with SenseFet for measuring the current in the lamp circuit
Figure 2:
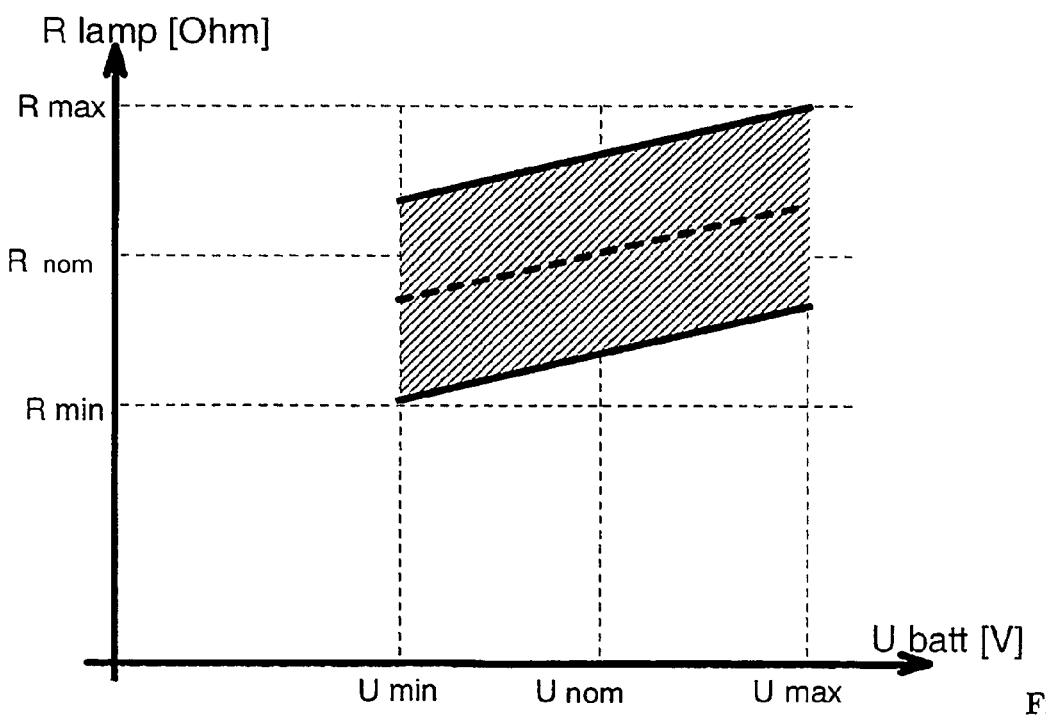
FIG. 2 shows a sketch of the achievable improvement in the description of the lamp resistance when a polynomial of the first order is used
Figure 3:
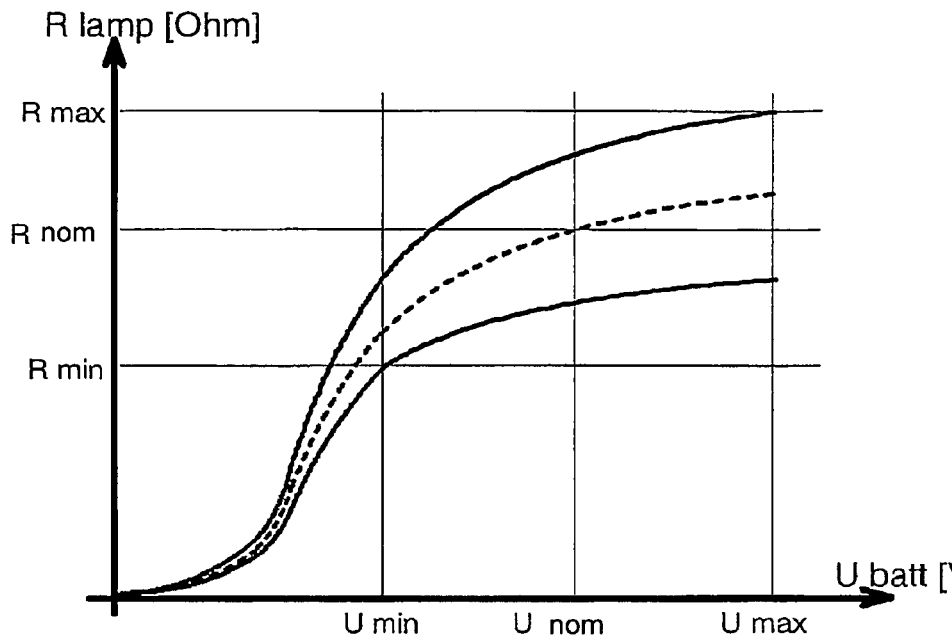
FIG. 3 shows a sketch of the actual lamp resistance procedure for different lamps

The lamp resistance over the applied voltage is a polynomial of a high order and is shown in principle in FIG. 3. For a diagnosis, it is sufficient to observe the resistance of the lamp in the working voltage range ($U_{min} \ldots U_{max}$). In this range, the resistance can be roughly approximated with a polynomial of the $1^{st}$ order, and can be approximated to a high degree of accuracy with a polynomial of the $3^{rd}$ order. Here, FIG. 2 makes clear that based on a nominal resistance under a nominal voltage and under a defined degree of fluctuation (thick lines around the broken central line), a fixed specification of threshold values $R_{max}$ and $R_{min}$ or an approach using the resistance value as a constant lead to statements which are so ambiguous that neither the installation of a lamp which deviates from the specification, nor a defect in a lamp with several lamps which are switched in parallel, can be detected.

This results in significant differences for all known variables (different lamp types and manufacturers, parameter scattering, ageing), which make a determination of the lamp power, in particular when different lamp types are switched in parallel, more imprecise, as can be seen from the degree of fluctuation shown in FIG. 3, whereby the broken line shows the average procedure, and the unbroken lines show the limits of the actual characteristic curves of the lamp.

A decisive step forward which shows an improvement over this method can be achieved by standardising the resistance (or the parameters) to the nominal power, and even better, to the nominal voltage.

Here, the polynomial of the voltage-dependant lamp resistance is multiplied by the nominal power of the lamp:

$$R_{spec} = \frac{U_{lamp}}{I_{lamp}} \cdot P_{nom}[\Omega \cdot W]; \qquad (\text{eq. 1})$$

Figure 4:
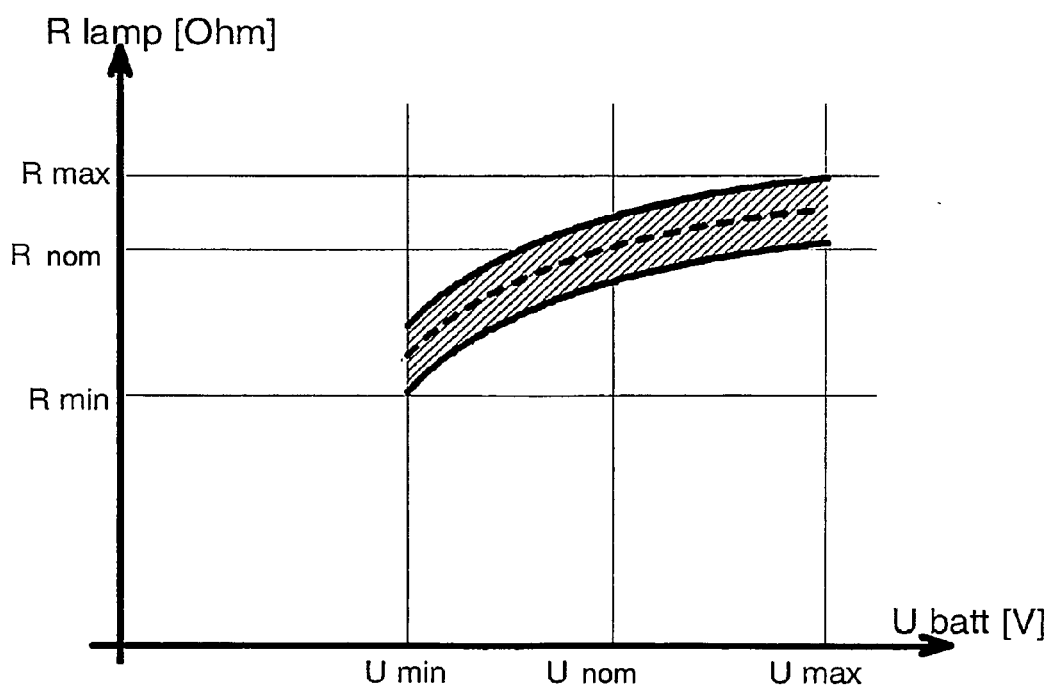
FIG. 4 shows the degree of fluctuation when a polynomial of the third order is used

It is then standardised to the shared nominal voltage, in order to offset the different nominal voltages for the different lamp types.

$$R_{spec\_norm} = R_{spec} \cdot \frac{U_{norm}}{U_{nom\_act}} \qquad (\text{eq. 2})$$

$$= \frac{U_{lamp}}{I_{lamp}} \cdot P_{nom} \cdot \frac{U_{norm}}{U_{nom\_act}}[\Omega \cdot W];$$

whereby $U_{norm}$ is the nominal voltage of the lamp, e.g. 12.0V and $U_{nom\_act}$ is the averaged voltage under the nominal voltage of a lamp type. These standardisations result in an almost identical polynomial $R_{spec\_stand}$ for all lamp types, in which only a narrow tolerance band now needs to be considered, as illustrated in FIG. 4.

By converting eq. 3, the precise nominal power of the lamp can be calculated from the polynomial, dependant on the operating voltage, or interpolated from a table:

$$P_{nom} = R_{spec\_norm} \cdot \frac{I_{lamp} \cdot U_{nom\_act}}{U_{lamp} \cdot U_{norm}}; \quad \text{(eq. 3)}$$

with $R_{spec\_norm} = a \cdot U^3 + b \cdot U^2 + c \cdot U + d \, [\Omega \cdot W]$;

The polynomial is determined using measuring rows, whereby the calculation of the specific standardised resistance is less prone to error, the fewer different lamp types are included in order to determine the polynomial.

Here, the level of error in the interpolation curves of $R_{spec\_stand}$ in relation to each other is lower than the component scattering with a lamp type.

Figure 5:
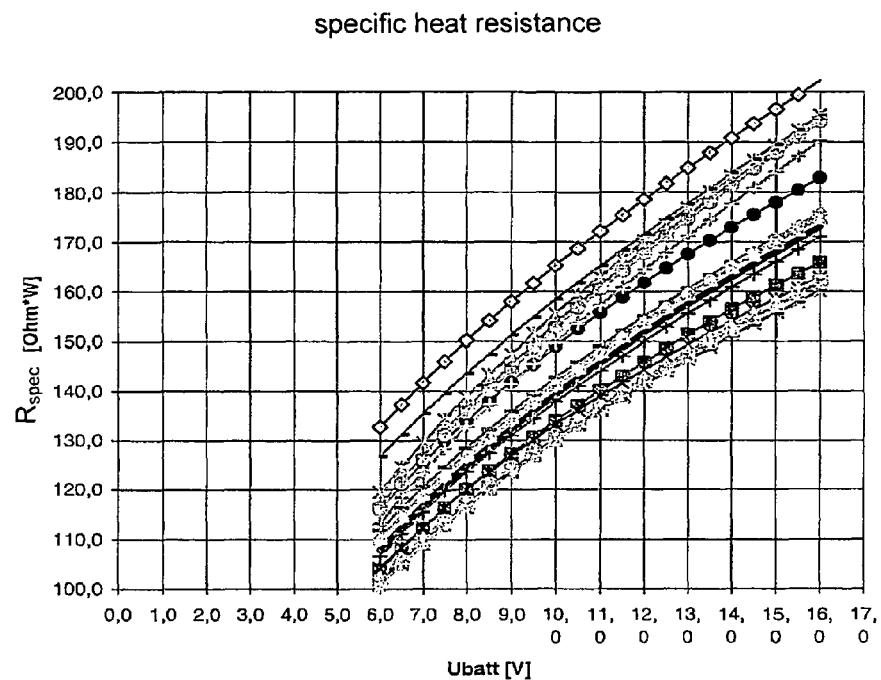
FIG. 5 shows the degree of fluctuation with different lamp types and standardisation to the nominal power

FIG. 5 now shows the degree of fluctuation following standardisation to the nominal power with real characteristic curves for approx. 15 lamps commonly used in the motor vehicle industry with a completely different nominal power (5-60 Watts). It can already be very clearly surmised from a visual inspection that lamps with a completely different nominal power, and therefore with a different inner resistance, can be standardised to a relatively high degree of precision.

The table below explains this principle in greater detail for certain selected lamp types. All lamps are motor vehicle lamps for 12-volt on-board networks.

Figure 6:
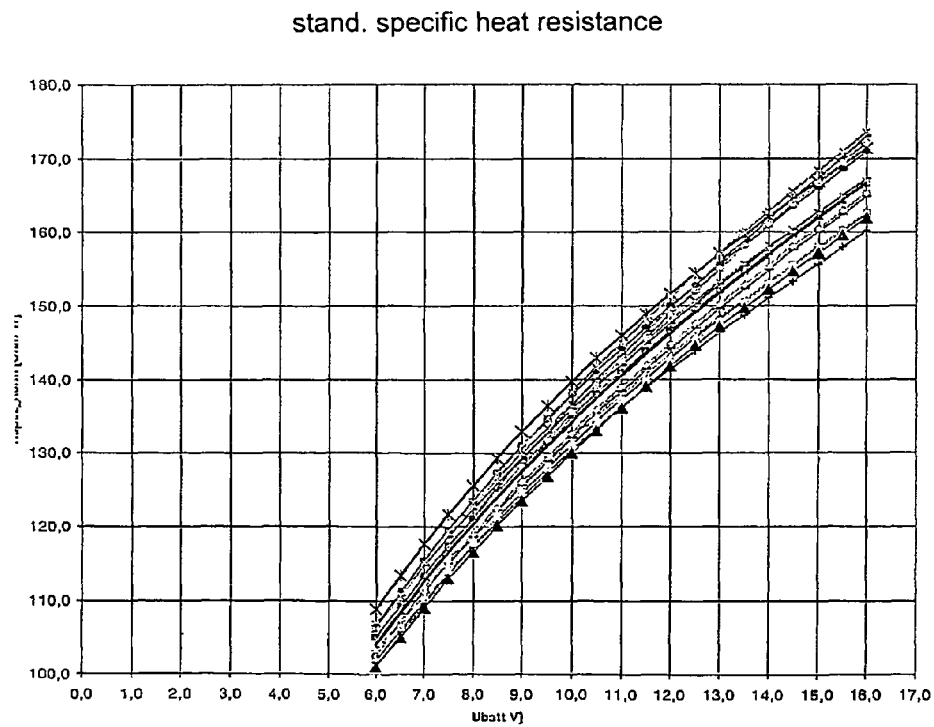
FIG. 6 shows the degree of fluctuation with different lamp types and standardisation to the nominal power and a shared average nominal voltage
Figure 7:
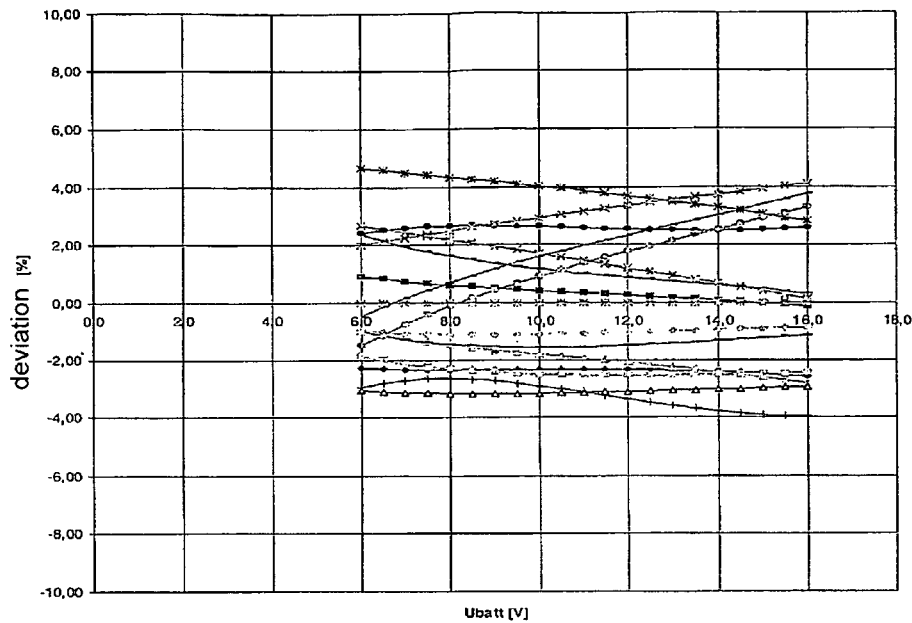
FIG. 7 shows the relative deviation with different lamp types and standardisation to the nominal power and a shared average nominal voltage

FIG. 6 shows the degree of fluctuation with different lamp types, which has again been significantly reduced as opposed to FIG. 5, and FIG. 7 shows the relative deviation with different lamp types and the standardisation to the nominal power and a shared average nominal voltage.

It has been assumed in the above description that the feed wires and their electric resistance have been negligible as opposed to the lamp resistance. However, precisely in motor vehicles, feed wires of up to 6 meters in length, and yet which have narrow diameters are sometimes laid, which leads to wire resistances of up to >200 Milliohms. If further wire resistances caused by corrosion and incomplete contact transitions now arise, then they can total up to 1 Ohm, and the losses occurring are not always negligible against lamp resistances of 3-30 Ohm.

For this reason, the opportunity is also provided to record and to take into account this resistance value in the wire.

For example, when the resistance of the spiral-wound filament(s) significantly alters due to age, this can be detected by taking measurements under different operating voltages.

Since the measurement of the operating voltage on the lamp by the electronic system would be very costly, the voltage can be more simply calculated by estimating the resistances in the load circuit. For this purpose, the operating voltage is measured on the control device input, and the voltage on the lamp is approximately calculated from the current and the resistances:

$$U_{lamp} = U_{batt} - I_{lamp} \cdot (R_{DSon} + R_{feed}); \quad \text{(eq. 4)}$$

| Lamp type | 1 | 2 | 3 | 4 | 5 | Ø with nominal voltage | Absolute scatt. | Relative scatt. |
|---|---|---|---|---|---|---|---|---|
| Nominal power [W] | 60 | 55 | 60 | 7 | 21 | | | |
| Nominal voltage [V] | 12.25 | 12.6 | 11.85 | 12.8 | 11.75 | | | |
| Nominal current [A] | 4.9 | 4.37 | 5.06 | 0.55 | 1.79 | | | |
| Rnom = U/I | 2.50 | 2.88 | 2.34 | 23.27 | 6.56 | | | |
| Rspec = R*Pnom | 150.00 | 158.58 | 140.51 | 162.91 | 137.85 | 149.97 | 10.93 | 7.29 |
| d [Ohm] = | 37 | 39.79 | 37.93 | 42.5 | 36.1 | 38.66 | 2.54 | 6.58 |
| c [Ohm / V] = | 13.86 | 14.73 | 13.29 | 13.9 | 13.5 | 13.86 | 0.55 | 3.97 |
| b [Ohm / V$^2$] = | −0.5068 | −0.558 | −0.4926 | −0.5 | −0.5075 | −0.51 | 0.03 | 5.04 |
| a [Ohm / V$^3$] = | 0.009 | 0.0103 | 0.0087 | 0.0095 | 0.0097 | 0.01 | 0.00 | 6.60 |

Here, the nominal voltage and the nominal current are the values which occur when the nominal power is present.

While the nominal resistances differ significantly among lamps with different powers (approx. 23 Ohm with a 7-Watt lamp as opposed to 2.5 Ohm with a 60-Watt lamp), the specific resistance value which is standardised to the nominal power is highly constant, with an average value of 150 and a percentage standard deviation of approx. 7%. In other words, lamps with a different nominal power can be characterised with a relatively high degree of precision using a specific reference value or corresponding parameter, a,b,c,d of the polynomial.

It can also be clearly seen in the examples in the above table that the lamps partly show voltage values when under the nominal power which already clearly deviate from the specified on-board network voltage of 12 volts. It can also be seen that the two 60-Watt lamp types also still show nominal resistance values which deviate from each other.

For this reason, a further standardisation is extended to a shared average nominal voltage, here of 12 volts.

whereby $R_{DSon}$ = the switch-on resistance of the power switch $R_{feed}$ = the resistance of the lamp feed, including the transition resistance on the lamp socket.

The precision of the calculation of the lamp power can however also be further increased without directly measuring the wire, when different operating voltage measurements are utilised in order to determine the nominal lamp power.

This is based on the fact that when the calculation is made according to eq. 3, the nominal power of the lamp must be constant. If a lamp circuit therefore shows deviating nominal voltages with two measurements made in succession with different voltages, without the lamp having been replaced, this can be used to deduce the influence of the feed wire.

Accordingly, a cyclical recording of the measured nominal power and the operating voltage can be made for a subsequent error analysis, whereby the recorded values are stored, at least when significant deviations occur from the specified values, thus providing several measurements under different operating conditions, which are available for verifying and deducing the error location or error type. In addition, a time reference, for example using a system counter, is also stored, so that when changes are made, this can be clearly assigned within correspondingly short time periods.

By calibrating the electronic system with a precisely defined load, the error of the current measurement circuit can be further reduced, thus further improving precision.

The procedure described above therefore makes it possible to calculate the nominal load connected to the switch output to a high degree of precision.

A further advantage of the invention lies in the comprehensive diagnosis options when two or more lamps are connected to a switch output, where at least the failure of one lamp, and preferably also the installation of lamps which do not comply with the specification is detected. This enables:
- savings in costs and space requirements through the reduction in the number of outputs or switches, i.e. several lamps are controlled with one output
- a reduction in the range of different variants (e.g. different rear light/brake light concept for the USA version, the connection of a sidemarker in the USA version, and the parallel switching of indicator lights)
- the detection of a potential overload due to the impermissible parallel switching of additional lamps The following table shows the different diagnosis options for different configurations:

Thanks to the significantly more precise determination, cases when
- L3 defective—nominal power still only approx. 40 Watts
- L1 or L2 defective—nominal power still approx. 25 Watts
- L3 and L1 or L2 defective—nominal power still approx. 20 Watts, can be differentiated from each other.

Since the nominal power can be given with a model-dependant tolerance of approx. 10%, the deviations can now be detected based on faults on the line.

The procedure can in addition be used both with continuous triggering and when the lamp is operated in clocking mode. With clocking mode, i.e. in particular with PWM triggering of the lamps, the nominal voltage on the lamp is preferably the same as the effective value of the output signal $$U_{lamp} \approx U_{batt} \sqrt{dc.};$$ (eq. 5)

with a dc.=(duty cycle)=switch-on multicycle control factor of the pulse width modulation, i.e. the quadratic correlation of the effective value is preferably taken into account, instead of a linear calculation $U_{lamp} \approx U_{batt} * T_{on}/T_{total}$.

It should be stated again that by altering the ohmic laws, this resistance model for lamps can also be used in the same way directly for the specification of current values which are dependant on the effective voltage, and the comparison with the current measured in each case is then made. An alternative would also be a comparison of the effective voltage with a set

|  | Diagnosis | | | | |
| --- | --- | --- | --- | --- | --- |
| Configuration | Connected nominal power | Lamp type | Failure of one lamp | Failure of two lamps | Wire data and condition |
| 1 lamp | yes | 2 measurements | yes | — | X |
| 2 lamps with same type | yes | 2 measurements | yes | yes | X |
| 2 lamps with different type | X | X) | yes | yes | X |
| 3 lamps with same type | yes | 2 measurements | yes | yes | X |
| 3 lamps with different type | X | X | yes | yes | X |
| N > 3 lamps with same type | yes | X | yes (for N ≦ 4) | yes (for N ≦ 6) | X |

X — plausibility from 2 measurements with different nominal voltage possible, in order to eliminate feed influences.

Figure 8:
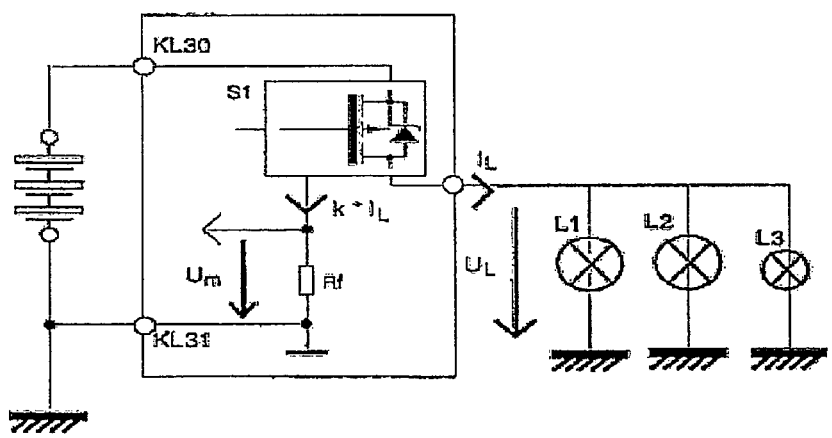
FIG. 8 shows the parallel switching of several lamps

The error detection options with parallel switched lamps will be explained using the example of an indicator light control according to FIG. 8, consisting of two 20-Watt lamps with the same construction at the front and rear of the motor vehicle, and an additional side light with 5 Watts, controlled via a shared switch. The table shows the resulting values with a nominal voltage of 12 volts.

| L1 | L2 | L3 | Total |
| --- | --- | --- | --- |
| 20 W | 20 W | 5 W | 45 W |
| 1.67 A | 1.67 A | 0.42 A | 3.75 A |
| 7.2 Ω | 7.2 Ω | 28.8 Ω | 3.2 Ohm |

It can immediately be seen that with the very rough threshold definition to offset temperature and voltage fluctuations which has been commonly made to date, it has never been possible to detect a failure of the smaller 5-Watt lamp, while even the failure or installation of a deviant 20-Watt lamp could hardly be detected, if a required tolerance of 50%±3 Ohm is taken into account.

voltage calculated from the effective current and resistance model, whereby the resistance value itself is in turn dependant on the effective voltage.

The invention claimed is:

1. A method for testing the function of a lamp circuit, having at least one lamp, the method comprising:
    measuring a current and voltage of the lamp circuit;
    specifying a resistance value as a polynomial having an order, depending on the measured voltage of the lamp circuit, wherein parameters of the polynomial are determined by a number of measurements which at least correspond to the order of the polynomial when operating conditions are known to differ, and the resistance value or a value derived from the resistance value are compared with a specified value.

2. A method according to claim 1, wherein the polynomial is at least a $2^{nd}$ order polynomial according to $R=b*U^2+c*U+d$ is used, wherein R is the resistance and U is the voltage.

3. A method according to claim 1, wherein the polynomial is at least a $3^{rd}$ order polynomial according to $R=a*U^3+b*U^2+c*U+d$, wherein R is the resistance and U is the voltage.

4. A method according to claim 1, wherein the resistance value is related to a nominal power, in which when measurements are taken under operating conditions, which are known to differ, the parameters of the polynomial of the resistance value are in each case multiplied by the nominal power.

5. A method according to claim 4, that the nominal power of the lamp circuit is calculated as the value to be compared with the specified value according to the formula:

$$P_{nom} = R_{spec} \cdot \frac{I_{lamp}}{U_{lamp}}$$ wherein $I_{lamp}$ is the effective current through the lamp circuit
$U_{lamp}$ is the effective voltage above the lamp circuit
$R_{spec}$ is the specific lamp resistance value in [Ω*W] related to the nominal power.

6. A method according to claim 4, wherein as a specified value, the set current through the lamp circuit under the effective voltage is calculated according to the formula:

$$I_{\text{lamp\_set}} = \frac{P_{nom} \cdot U_{lamp}}{R_{spec}}$$

7. A method according to claim 1, wherein the parameters of the polynomial of the resistance value are specified for a specified quantity of lamps which may be potentially used, wherein the lamps show nominal voltages which deviate from each other under the nominal voltage, and the resistance value is standardised to a shared nominal voltage, in which when measurements are taken under operating conditions which are known to differ, the parameters of the polynomial of the resistance value are in each case multiplied by the ratio of the shared nominal voltage to the averaged voltage of the lamps under nominal voltage.

8. A method according to claim 7, wherein the nominal power is calculated as the value to be compared with the specified value according to the formula:

$$P_{nom} = R_{\text{spec\_norm}} \cdot \frac{I_{lamp} \cdot U_{\text{nom\_act}}}{U_{lamp} \cdot U_{norm}};$$ wherein $L_{lamp}$ is the effective current through the lamp circuit
$U_{lamp}$ is the effective voltage above the lamp circuit
$R_{spec\_norm}$ is the specific lamp resistance value in [Ω*W] in relation to a shared nominal voltage and nominal power
$U_{norm}$ is the agreed shared nominal voltage, and
$U_{nom\_act}$ is the calculated voltage of all lamps under the nominal voltage.

9. A method according to claim 7, wherein as a specified value, the set current through the lamp circuit under the effective voltage is calculated according to the formula:

$$I_{\text{lamp\_set}} = \frac{P_{nom} \cdot U_{lamp}}{R_{\text{spec\_norm}}} \cdot \frac{U_{norm}}{U_{\text{nom\_act}}}.$$

* * * * *